(12) United States Patent
Petz et al.

(10) Patent No.: US 6,597,242 B2
(45) Date of Patent: Jul. 22, 2003

(54) RECONFIGURABLE DEVICE FOR AMPLIFYING RF SIGNALS

(75) Inventors: Felix Anton Petz, Leiderdorp (NL); Wolfgang Bosch, Giuseley (GB); Manfred Wittig, Lisse (NL)

(73) Assignee: Agence Spatiale Europeenne (FR)

( * ) Notice: Subject to any disclaimer, the term of this patent is extended or adjusted under 35 U.S.C. 154(b) by 0 days.

(21) Appl. No.: 10/041,820

(22) Filed: Oct. 19, 2001

(65) Prior Publication Data
US 2002/0097087 A1 Jul. 25, 2002

(30) Foreign Application Priority Data
Oct. 31, 2000 (FR) ................................. 0014021

(51) Int. Cl.[7] .............................. H03F 1/14; H03F 3/68
(52) U.S. Cl. ...................................... 330/51; 330/124 R
(58) Field of Search .............................. 330/51, 124 D, 330/124 R, 285, 295

(56) References Cited

U.S. PATENT DOCUMENTS

2002/0084844 A1 * 7/2002 Monroe ....................... 330/51

* cited by examiner

Primary Examiner—Steven J. Mottola
(74) Attorney, Agent, or Firm—Bachman & LaPointe, P.C.

(57) ABSTRACT

The present device comprises a power divider network, to which a signal to be amplified is applied, for distributing the power of the signal among several amplifying channels, one amplifier per amplifying channel for amplifying the power-divided signal, and a power combiner circuit for combining the amplified signals at the output of each channel into a single signal, the RF power desired at the output of the device determining the number of amplified signals to be combined, the amplifier of each channel comprising an integrated circuit including a controllable output transistor for deactivating the amplifier, the power combiner circuit comprising a quarter wave impedance transformer circuit for each channel connected to a common junction node coupled to the device output.

10 Claims, 3 Drawing Sheets

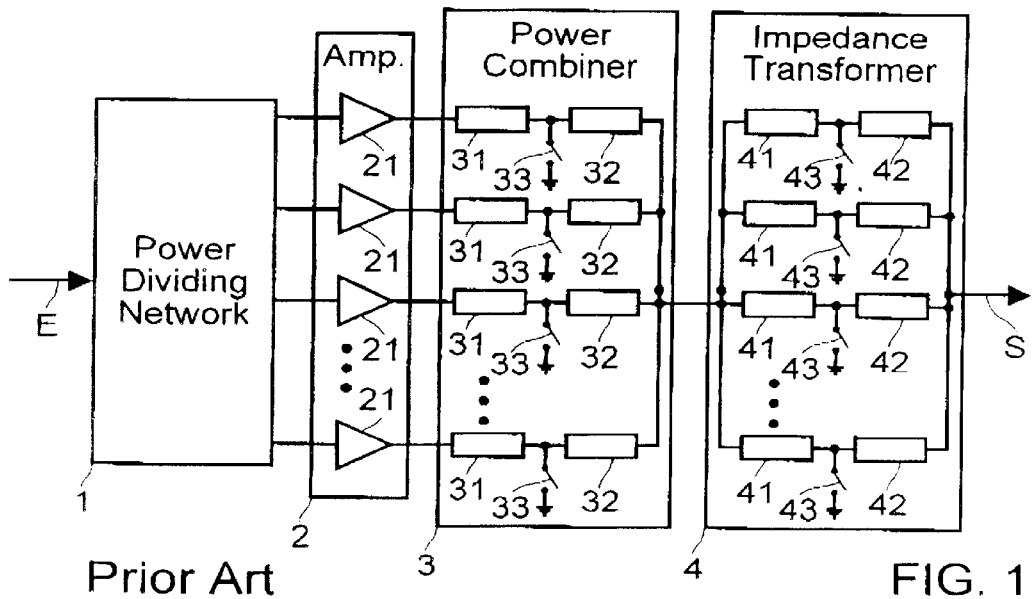
Prior Art FIG. 1
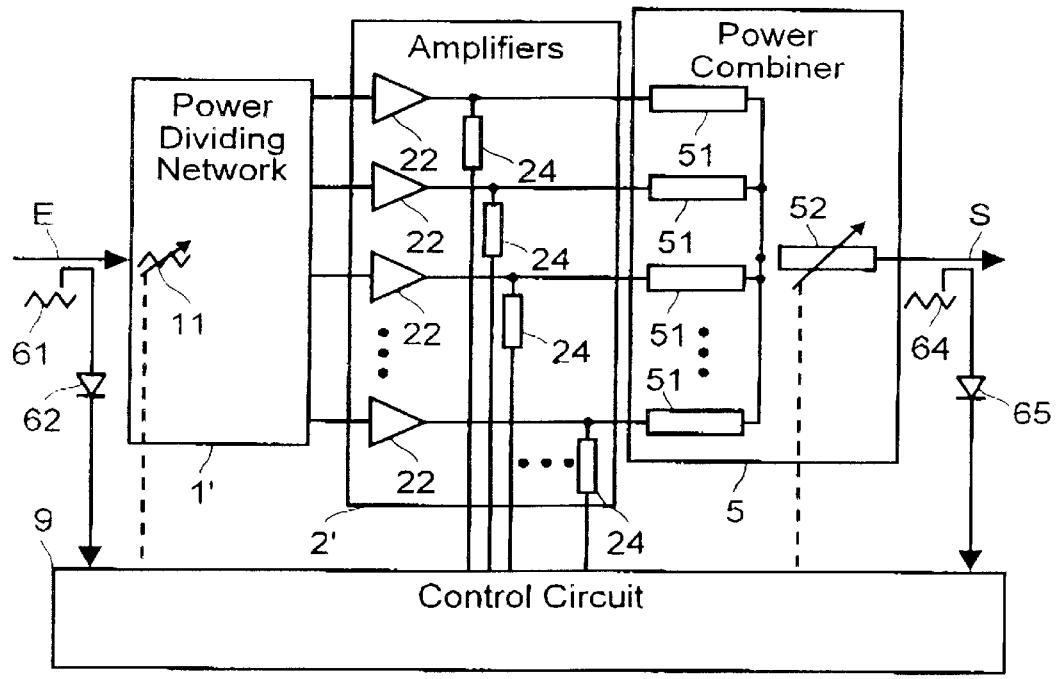
FIG. 2

RECONFIGURABLE DEVICE FOR AMPLIFYING RF SIGNALS

BACKGROUND OF THE INVENTION

1. Field of the Invention

The present invention relates to a reconfigurable device for amplifying and combining RF (radio frequency) signals.

In particular, although not exclusively, it applies to satellite transmission devices using transmission frequencies in the microwave band, for example on the order of 20 GHz or above, or in Ka band (approximately 35 GHz).

2. Description of the Related Art

Conventionally, devices of this kind comprise a passive or active power divider network to which the input signal is applied, for distributing the input signal power among several power signals that are amplified by means of a respective amplifier, for example of the SSPA type (Solid State Power Amplifier).

Thereafter, the various amplified signals are applied to a switched power combiner circuit based on delay lines, providing a signal whose power is the sum of the powers of the amplified signals, wherein the desired output RF power determines the number of amplified signals to be combined, which is selected by means of switches. The combiner circuit output signal is input to a switched impedance transformer circuit which supplies an amplified output signal. All of these circuits comprise electromechanical or electronic switch units for activating the desired number of amplifiers and for carrying out the power summation function.

According to the frequency, the RF power level, the number of input branches and the required combining or routing flexibility, this device may be quite bulky and heavy, highly complex, both on an electrical and a mechanical point of view. Furthermore, insertion losses, specifically in the switch units, may be very large, even in the DC component of the signals, and the switch units consume a large amount of power.

Moreover, these devices have a limited reliability which, in particular, results in the use of vacuum tube amplifiers and electromechanical switch units.

Due to these drawbacks, such a device is not well adapted to be embarked on a satellite.

In addition, there are microwave amplifiers implemented as integrated circuits. However, these amplifiers have insufficient output power, specifically for transmission systems used in communications satellites. This drawback can be overcome by using several amplifiers in parallel preceded by a power divider circuit to which the signal to be amplified is input and followed by a power combining circuit which supplies a signal having a power equal to the sum of the powers output by the respective amplifiers.

Such devices are, for example, known from U.S. Pat. Nos. 4,315,322, 4,780,685 and 4,965,530. However, when one of the amplifiers fails, it affects the operation of the remaining circuitry by causing power losses due to impedance mismatch. It is therefore necessary to provide means for monitoring the operation of each amplifier and for disconnecting a faulty amplifier by grounding the corresponding amplifying channel by means of switches. The presence of switches in the off position also proves to cause power losses and a circuit mismatch. As a consequence, when the number of switches in the off position increases, losses increase. Accordingly, it is not desirable that one or several amplifiers be thus disconnected.

SUMMARY OF THE INVENTION

It is an object of the present invention to eliminate these drawbacks and to provide a device of the above-described type wherein the output power may be adapted on demand, which device comprises a power divider network to which the input signal is applied and which distributes the signal among several channels, each of the channels comprising an amplifier, the amplifier outputs being applied to a power combiner circuit comprising a quarter wave impedance transformer circuit for each channel connected to the device output.

According to the present invention, the amplifier of each channel comprises an integrated circuit including a controllable output transistor for deactivating the amplifier, the power combiner circuit comprising a quarter wave impedance transformer circuit for each channel connected to a common node coupled to an output of the device.

With respect to the prior art devices, the present invention not only allows lighter, less bulky and more reliable amplifiers to be used, but also to eliminate a switch and a quarter wave delay line per channel. This results in a circuit which is much less bulky and lighter and which requires reduced supply power. This solution also has the advantage of leading to a greater reliability as a result of its redundant construction wherein the amplifiers operate in parallel, and a defective amplifier can be replaced by an idle amplifier.

Advantageously, semiconductor power amplifiers are composed of solid-state monolithic integrated circuits and are controllable through their drain current, so that the prior art switched impedance transformer circuit can further be eliminated.

In such a device, the quarter wave impedance transformer circuits in the power combiner circuit determine the load of the power amplifiers and therefore, the gain of the latter, which increases if the number of activated amplifiers is reduced. As a result, the transistors in the amplifiers reach saturation more rapidly, so that the power handling capability of the device decreases.

According to a feature of the present invention, this drawback is overcome by a load impedance control circuit arranged at the output of the power combiner, and constituted by a quarter wave impedance transformer circuit with adjustable impedance.

According to another feature of the present invention, this device comprises means for adjusting the bias level of the amplifiers as a function of the number of activated amplifiers. In particular, the increase in the load impedance due to a decrease in the number of activated amplifiers is compensated for by a decrease in the bias of the amplifier drain current. This solution has the advantage of requiring a reduced number of switch units, since the same drain current may be applied to all amplifiers.

A combination of the latter two provisions may also be envisioned, for example, by using a simplified load impedance control circuit and two levels of amplifier drain current.

An embodiment of the device according to the present invention will be described below by way of non-limiting example with reference to the attached drawings.

BRIEF DESCRIPTION OF THE DRAWINGS

FIG. 1 shows a prior art device for amplifying RF signals;

FIG. 2 shows a device for amplifying RF signals according to the present invention;

DESCRIPTION OF THE PREFERRED EMBODIMENTS

Figure 3:
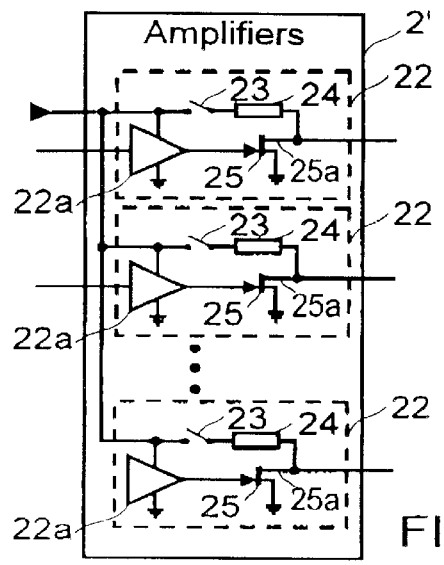
FIG. 3 is a detailed view of the amplifying circuit of the device shown in FIG. 2.

FIG. 1 shows a prior art device comprising a power divider network 1 to which an input signal is applied, for distributing the power of this signal among several output channels, the outputs of the divider network being applied to an amplifying circuit 2 comprising one amplifier 21 per channel. The outputs of the channels of the amplifying circuit 2 are applied to a power combiner circuit for combining the output signals of amplifiers 21 into a single signal which is applied to the input of an impedance transformer circuit 4, the output of the latter circuit being the device output S.

Each input channel of the power combiner circuit 3 comprises two quarter wave lines 31, 32 provided in series, the junction node therebetween being grounded through a switch 33 for selecting the number of amplifying channels to be used for making up the output signal.

The impedance transformer circuit 4 comprises a plurality of channels provided in parallel arranged between the output of circuit 3 and the device output S, each channel comprising two quarter wave lines 41, 42 provided in series, the junction node therebetween being grounded through a switch 43.

This construction proves to be relatively complex and bulky and requires the implementation of a large number of switches which also are weighty and bulky, therefore leading to limited reliability and high power consumption.

FIG. 2 shows an amplifying device according to the present invention which is particularly designed for use in a transmission device on board a satellite, such as a communications satellite. This device comprises a power divider circuit 1' to which the signal E to be processed is input. This circuit comprises a divider network which distributes the input signal power among a plurality of channels, each of the channels receiving an equal power and being applied to a respective channel of a power amplifying circuit 2' having one power amplifier 22 per channel. The output of each amplifier 22 is applied to a respective input of a power combiner circuit 5 for recombining the set of input amplified signals into a single output signal S, the power of signal S corresponding substantially to the sum of the respective powers of the signals at the output of amplifiers 22.

The output of amplifiers 22 is also applied through a standard drain bias impedance 24 to a control circuit 6 for separately controlling the activation of each amplifier 22, so as to adjust the output signal power as a function of the input signal power E. The impedance 24 is, for example, comprised of an inductor having a zero ohmic resistance, but a high impedance at RF frequencies.

For that purpose, the device according to the present invention comprises a measurement unit 51 for measuring the input signal power, coupled to the control circuit 6 through a diode 62.

Moreover, the power divider circuit 1' comprises an adjustable power attenuating unit 11 to which the input signal E is applied, which unit is controlled by the control circuit 6 as a function of the number of activated amplifiers 22. The attenuation applied in dB is equal to 10.log(N), for instance, so as to ensure a constant gain whatever the number of activated amplifiers 22.

Each amplifier 22 has a limited output power handling capability. By activating sequentially several amplifiers 22 operating in parallel, the required output power may be reached and maintained while remaining in the power handling capability range of each amplifier.

For example, the power divider network is of the Wilkinson type with equal power in each channel.

Amplifiers 22 are of the monolithic solid-state type such as an MMIC (Monolithic Microwave Integrated Circuit). They may be activated or deactivated separately by controlling the bias voltage of their respective drain. If the power of the input signal and the attenuation applied by the attenuating unit 11 are kept constant, the output signal power varies proportionally to the number of activated amplifiers. Thus, the output power $P_S$ may be equal to $n.G.P_E$, where n is the number of activated amplifiers, G is the gain of each amplifier and $P_E$ is the input signal power.

The power combiner circuit 5 comprises N quarter wave transformers 51 interconnected as a star, with one transformer per amplifying channel, and with the other respective terminal of the transformers coupled to a respective output of amplifier 22. For example, the quarter wave transformers are implemented as strip lines. Preferably, they are arranged close of the output transistor drains of the amplifiers.

The combiner circuit thus makes it possible to combine the output power of the amplifiers according to a coherent summation law, with amplifiers 22 providing respective signals that are equal in amplitude and phase.

It should be noted that the respective output transistors of the non-activated amplifiers provide a grounding of very low resistance, transformed into a very high impedance link at the junction node of the star assembly, so that any power loss through the inactive amplifier is avoided.

The combiner circuit 5 further comprises an adjustable quarter wave impedance transformer 52, connected to the junction node of the star assembly, while the other transformer terminal is connected to the device output S. This transformer 52 is controlled so as to keep the drain load impedance of amplifiers 22 constant, whatever the number of activated amplifiers.

The number of required traffic channels, that is the required power, is applied at the input of control circuit 6, which has a look-up table giving, as a function of the required power, the parameters needed for adjusting the attenuating unit 11 and the quarter wave transformer 52, as well as the number of amplifiers to be activated.

The control circuit 6 also has a measurement unit 64 for measuring the output power PS, which is connected to the control circuit through a diode 65, and means for comparing the measured output power with the required power. If the control circuit detects a deviation, it starts a procedure for checking the amplifier operating status resulting in a modification of the number of active amplifiers to restore the required power. Thus, if an amplifier is detected as defective, the next available amplifier in the amplifying circuit 2' is automatically activated.

The device according to the present invention is therefore capable of operating appropriately, even if one or more amplifiers are defective.

The control circuit further comprises an output to which it sends messages relating to the status of the amplifying device and indicating, in particular, the possibly defective amplifiers.

As shown in more detail in FIG. 3, each amplifier 22 is composed of a preamplifier stage 22a having an input connected to an output of the power divider circuit 1' and an output connected to the gate of a transistor 25 giving the output status of the amplifier. The gate of each transistor 25 is connected to the output of the pre-amplifying stage 22a, whereas the drain 25a of each transistor 25 is connected to the power combiner circuit 1', as well as to the impedance 24 which is connected in series to a switch 23 having its other terminal coupled to the positive power input of the preamplifier stage 22a. The source of transistor 25 is grounded, similarly to the negative power terminal of the preamplifier stage.

The respective junction nodes between switches 23 and the positive power input of preamplifier stages 22a are interconnected and coupled to a common drain bias voltage source, so as to control the bias level of transistors 25 which are all identical.

The switches 23, which are of the electronic type, are controlled separately by the control circuit 6 so as to activate or deactivate each amplifier 22. When the bias voltage of one transistor 25 is zero (switch 23 is in the off position), it has a nearly zero drain-source impedance, so that the output of amplifier 22 is grounded.

In this arrangement, the quarter wave transformers in the power combiner circuit 5 set the load of amplifiers 22.

Figure 5:
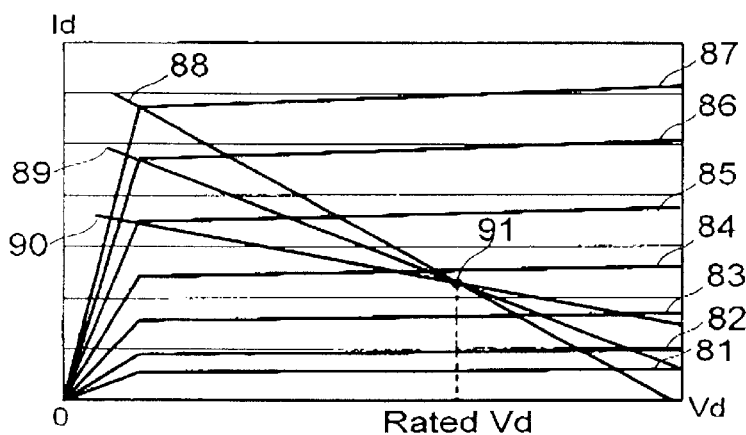
FIGS. 5 to 8 show different curves illustrating the operation of the device shown in FIG. 2.
Figure 6:
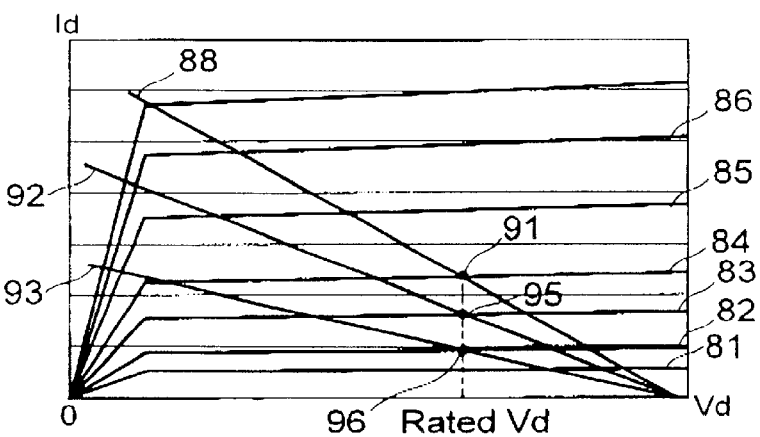

FIGS. 5 and 6 show the drain current variation curves 81 to 87 at the output of amplifiers 22 as a function of the drain voltage applied to transistors 22a, with the number of activated amplifiers ranging from 1 (curve 81) to N (curve 87).

In FIG. 5, the straight line 88 represents the load line for N activated amplifiers when the circuit is set so as to obtain a maximum RF power handling capability for N activated amplifiers, it can be seen that this line tends to become parallel to the abscissa axis when the number of activated amplifiers is reduced (see lines 89 and 90), with a point 91 being common to all of these lines and corresponding to the rated drain voltage, and therefore to the bias level of transistors 22a.

As a result, the gain of the activated amplifiers increases, and therefore, each transistor 22a saturates at a lower control voltage. As a consequence, the amplifier's power handling capability is reduced.

To overcome this drawback, the adjustable quarter waver transformer 52 must be controlled so as to adjust the load impedance of the amplifiers 22, that is, to keep the slope of the load line constant at the same value as that of the load line 88, when all amplifiers are activated.

Figure 4:
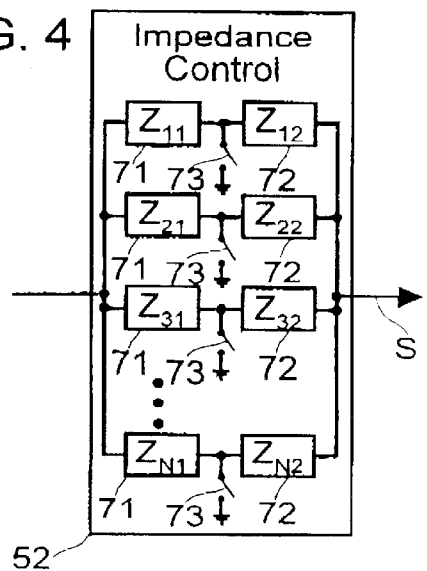
FIG. 4 is a detailed view of a portion of the power combiner circuit in the device shown in FIG. 2.

For that purpose, the adjustable quarter wave transformer 52 may be implemented as shown in FIG. 4. In this figure, transformer 52 comprises N parallel branches with their ends respectively coupled to the input and output of the transformer, where N is the number of amplifiers 22. Each branch comprises two series-connected quarter wave lines 71, 72, the junction node between both quarter wave lines being grounded through an electronic switch 73 which is controlled by the control circuit 6, so that only one switch 73 is in the off position at a time.

Thus, the impedance transformation performed by such a circuit is as follows:

$$R_I = R_O \cdot Z_{n1}^2 / Z_{n2}^2 \quad (1)$$

where $R_I$ and $R_O$ are the input and output transformer impedances 52, respectively, and $Z_{n1}$ and $Z_{n2}$ are the quarter wave line impedances 71 and 72, respectively, of branch n having its switch 73 in the off position. The impedances $Z_{n1}$ and $Z_{n2}$ (1=n=N) are such that $R_I$ is equal to $R_O \cdot N/n$.

The switches 73 may comprise diodes, since even at a high power, the power handling of diodes constraints remain low. In the on state, the impedance of the diode is small and, since the current is also small, losses are low. However, the diodes should be able to accommodate relatively high RF voltages in the off state.

Another solution for maintaining the efficiency of amplifiers consists in adjusting the bias level of the transistors (drain current), whereby the input RF power must be adapted accordingly.

As seen in FIG. 6, this adjustment (displacement of the bias level 91, 95, 96) causes a shift in the load line 88, 92, 93 (which tends to become parallel to the abscissa) when the number of activated amplifiers is decreased. This action leads to an increase in the load impedance.

The adjustment of the bias level may be carried out simply by controlling the gate bias voltage of transistors 22a so as to reduce the drain bias current when the number of activated amplifiers is reduced, the drain bias voltage being constant and equal to the rated drain voltage Vd.

However, with this solution, the increase in gain and therefore, the decrease in power handling capability, cannot be compensated for.

Preferably, both solutions are combined, for example by means of two drain current levels, whereby the complexity of control circuit 52 and the impedance of the load line are reduced (by half).

Figure 7:
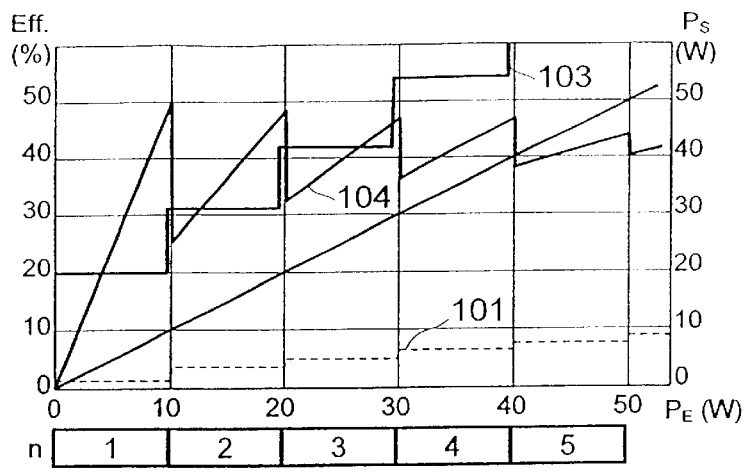
Figure 8:
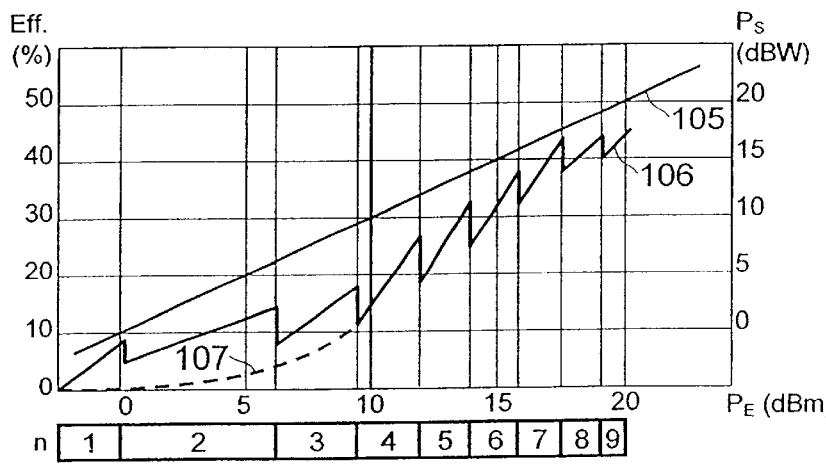

The curves shown in FIGS. 7 and 8 illustrate the operation of the device according to the present invention and enable its performance to be appreciated as a function of input power $P_E$.

The curves shown in FIG. 7 correspond to a device comprising ten amplifiers of 10 W each, and a load impedance control circuit, the bias of the amplifiers being fixed. In this figure, curve 101 represents the attenuation applied by attenuating unit 11, which attenuation depends on the input power $P_E$ and is proportional to the number n of activated amplifiers. Curve 102 shows the output power $P_S$ which increases linearly as a function of the input power. Curve 103 represents the change in the power applied at the drains of the amplifiers, which increases as a function the number of activated amplifiers. Curve 104 represents the efficiency of the device in terms of power handling, which curve being close to 50% at maximum whatever the number of active amplifiers and going towards a value located beyond 40% when the number of activated amplifiers increases to the maximum number.

The curves in FIG. 8 correspond to a device comprising, for instance, ten amplifiers of 10 W each and having 40 dB gain at a controlled rated drain bias, wherein this device does not have a load impedance control. In this figure, curve 105 represents the output power $P_S$ as a function of input power $P_E$ which increases with the number n of activated amplifiers. Curve 106 shows the change in the efficiency of the device which increases to a value greater than 40% from eight activated amplifiers. In practice, the minimum number of activated amplifiers is three for a minimum power capability of 4 W. In this case, the efficiency curve follows the contour 107 shown in dash lines for input powers $P_E$ smaller than the minimum power required for activating three amplifiers, or about 10 dBm.

Although the device just described has a certain redundancy, it may undergo two critical failures, namely in the case when the output transistor of one amplifier is disconnected from the output of said amplifier, and in the case when the switch is blocked in the on position, preventing the number or activated amplifiers to be adapted as a function of the power required at the output.

Figure 9:
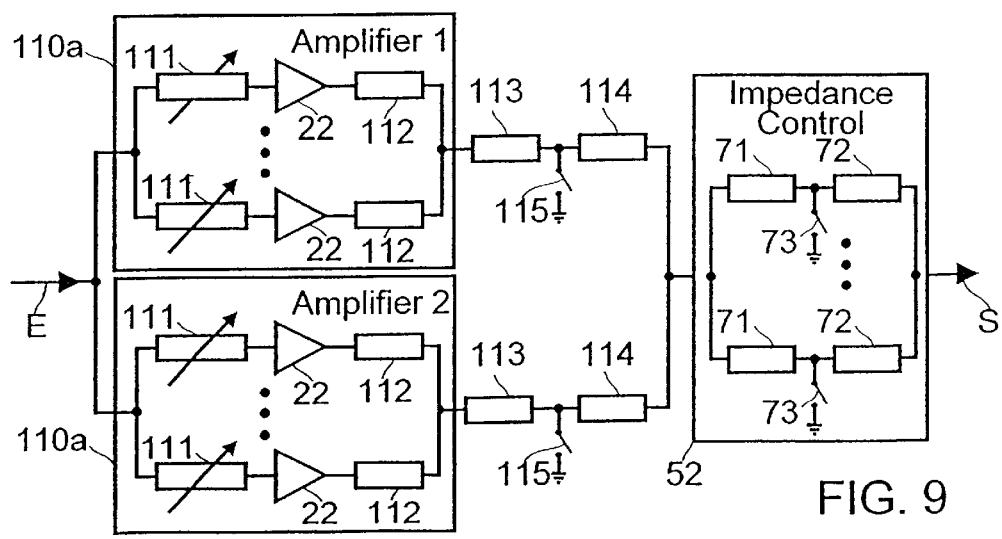
FIG. 9 shows a device including two redundant amplifier devices according to the present invention.

To overcome this drawback, the device according to the present invention comprises, as shown in FIG. 9, two redundant amplifier blocks 110a, 110b to which the input signal is applied, each amplifier device having its output connected to a respective switch unit, comprising two series-connected quarter wave lines 113, 114, having their junction node grounded through an electronic switch 115, the output of each of these switch units being connected to a common impedance control circuit 52. Each amplifying block 110a, 110b comprises N channels, for example 5, which are coupled to the input E of the device, each channel comprising an amplifier 22 and a quarter wave line 112.

The electronic switches 115 for example, may comprise diodes which are in the on state in the normal operation of the device. In case of failure of one of the two amplifier blocks 110a, 110b, the corresponding switch 115 closes, so that the defective amplifier block is disconnected from the device output. In this case, the maximum output power capability is divided by two (3 dB degradation).

It should be noted that the switching diodes in the impedance control circuit 52 are neither critical in the open circuit state (the current power adjustment step becomes the only one usable), nor in the closed circuit state (leading to a simple reduction in the number of RF power adjustment steps). In order to avoid such limitations, the switches 73 may be implemented by two parallel-connected diodes.

Alternatively, each amplifier block 110a, 110b may comprise its own impedance control circuit 52, the switch units 113, 114, 115 being placed at the output of amplifier blocks 110a and 110b.

There is claimed:

1. A device for amplifying RF signals comprising a power divider network to which an input signal to be amplified is applied, said power divider network distributing the power of said input signal among several amplifying channels, one amplifier per amplifying channel for amplifying the power-divided signal, and a power combiner circuit for combining an amplified signal output from each amplifying channel into a single signal, wherein a desired RF power at an output of the device determines the number of amplified signals from the amplifying channels to be combined, the amplifier of each said amplifying channel comprising an integrated circuit including an output transistor which is controllable for deactivating the amplifier, and the power combiner circuit comprising a quarter wave impedance transformer circuit for each amplifying channel connected to a common junction node coupled to the device output.

2. A device as claimed in claim 1, wherein the amplifiers each comprise a solid-state monolithic integrated circuit and are controlled through a drain current.

3. A device for amplifying RF signals comprising a power divider network to which an input signal to be amplified is applied, said power divider network distributing the power of said input signal among several amplifying channels, one amplifier per amplifying channel for amplifying the power-divided signal, and a power combiner circuit for combining an amplified signal output from each amplifying channel into a single signal, wherein a desired RF power at an output of the device determines the number of amplified signals from the amplifying channels to be combined, the amplifier of each said amplifying channel comprising an integrated circuit including an output transistor which is controllable for deactivating the amplifier, the power combiner circuit comprising a quarter wave impedance transformer circuit for each amplifying channel connected to a common junction node coupled to the device output and a load impedance circuit interposed between the common junction node of the power combiner circuit and the device output, which load impedance circuit comprises a quarter wave impedance transformer circuit with adjustable impedance.

4. A device as claimed in claim 3, wherein the adjustable quarter wave transformer circuit has as many parallel branches as there are amplifying channels and each parallel branch comprises two series-connected quarter wave lines, wherein the junction node between the quarter wave lines is grounded through an electronic switch, and wherein the switches of the circuit are controlled so that only one switch is open at a time.

5. A device for amplifying RF signals comprising a power divider network to which an input signal to be amplified is applied, said power divider network distributing the power of said input signal among several amplifying channels, one amplifier per amplifying channel for amplifying the power-divided signal, and a power combiner circuit for combining an amplified signal output from each amplifying channel into a single signal, wherein a desired RF power at an output of the device determines the number of amplified signals from the amplifying channels to be combined, the amplifier of each said amplifying channel comprising an integrated circuit including an output transistor which is controllable for deactivating the amplifier, the power combiner circuit comprising a quarter wave impedance transformer circuit for each amplifying channel connected to a common junction node coupled to the device output, and means for adjusting a bias level of the amplifiers as a function of a number of activated amplifiers.

6. A device for amplifying RF signals comprising a power divider network to which an input to be amplified is applied, said power divider network distributing the power of said input signal among several amplifying channels, one amplifier per amplifying channel for amplifying the power-divided signal, and a power combiner circuit for combining an amplified signal output from each amplifying channel into a single signal, wherein a desired RF power at an output of the device determines the number of amplified signals from the amplifying channels to be combined, the amplifier of each said amplifying channel comprising an integrated circuit including an output transistor which is controllable for deactivating the amplifier, the power combiner circuit comprising a quarter wave impedance transformer circuit for each amplifying channel connected to a common junction node coupled to the device output, and means for compensating an increase in load impedance due to a decrease in a number of activated amplifiers by decreasing a drain current bias of the amplifiers.

7. A device as claimed in claim 1, wherein the power combiner circuit comprises a quarter wave transformer for each said amplifying channel provided close to a drain of a corresponding power amplifier.

8. A device for amplifying RF signals comprising a power divider network to which an input signal to be amplified is applied, said power divider network distributing the power of said input signal among several amplifying channels, one amplifier per amplifying channel for amplifying the power-divided signal, and a power combiner circuit for combining an amplified signal output from each amplifying channel into a single signal, wherein a desired RF power at an output of the device determines the number of amplified signals from the amplifying channels to be combined, the amplifer of each said amplifying channel comprising an integrated circuit including an output transistor which is controllable for deactivating the amplifier, the power combiner circuit comprising a quarter wave impedance transformer circuit for each amplifying channel connected to a common junction node coupled to the device output, said power divider network comprising a frequency divider network, an adjustable attenuating unit for attenuating the power of the input signal before said input signal is applied to the frequency divider network, a measurement unit for measuring the input signal power, and control means which are supplied at an input with an output power reference value for controlling the attenuating unit as a function of the input signal power measured by the measurement unit, and the number of said amplifiers to be activated as a function of a received output power reference value.

9. A device for amplifying RF signals comprising a power divider network to which an input signal to be amplified is applied, said power divider network distributing the power of said input signal among several amplifying channels, one amplifier per amplifying channel for amplifying the power-divided signal, a power combiner circuit for combining an amplified signal output from each amplifying channel into a single signal, wherein a desired RF power at an output of the device determines the number of amplified signals from the amplifying channels to be combined, the amplifier of each said amplifying channel comprising an integrated circuit including an output transistor which is controllable for deactivating the amplifier, the power combiner circuit comprising a quarter wave impedance transformer circuit for each amplifying channel connected to a common junction node coupled to the device output, a measuring unit for measuring the power of the output signal coupled to a control circuit, the control circuit comprising means for comparing the output signal power with a received output power reference value, and means for checking an operating status of the amplifiers, which checking means is activated when a difference is detected between the measured output signal power and the output power reference value.

10. A device for amplifying RF signals comprising a power divider network to which an input signal to be amplified is applied, said power divider network distributing the power of said input signal among several amplifying channels, one amplifier per amplifying channel for amplifying the power-divided signal, a power combiner circuit for combining an amplified signal output from each amplifying channel into a single signal, wherein a desired RF power at an output of the device determines the number of amplified signals from the amplifying channel comprising an integrated circuit including an output transistor which is controllable for deactivating the amplifier, the power combiner circuit comprising a quarter wave impedance transformer circuit for each amplifying channel connected to a common junction node coupled to the device output, two redundant amplifying devices which are supplied in parallel with the input signal to be amplified, the output of both amplifying devices being connected to a respective switch unit for deactivating one of the two amplifying devices when said one amplifying device is detected as being defective, and the output of the respective switch units being coupled to an input of an impedance control circuit.

* * * * *